United States Patent
Bennett et al.

(10) Patent No.: US 7,817,655 B1
(45) Date of Patent: Oct. 19, 2010

(54) DETERMINING SIZES OF FIFO BUFFERS BETWEEN FUNCTIONAL BLOCKS IN AN ELECTRONIC CIRCUIT

(75) Inventors: David W. Bennett, Silverthorne, CO (US); Jeffrey M. Mason, Eldorado Springs, CO (US)

(73) Assignee: Xilinx, Inc., San Jose, CA (US)

( * ) Notice: Subject to any disclaimer, the term of this patent is extended or adjusted under 35 U.S.C. 154(b) by 23 days.

(21) Appl. No.: 12/261,191

(22) Filed: Oct. 30, 2008

(51) Int. Cl.
 *H04L 12/28* (2006.01)
(52) U.S. Cl. ...................................... 370/412; 709/235
(58) Field of Classification Search .................. 370/412; 709/235
 See application file for complete search history.

(56) References Cited

U.S. PATENT DOCUMENTS

| | | | |
|---|---|---|---|
| 7,039,074 B1 * | 5/2006 | Calderone et al. | 370/542 |
| 7,346,483 B2 | 3/2008 | Toma et al. | |
| 2003/0023914 A1 * | 1/2003 | Taylor et al. | 714/733 |
| 2003/0103460 A1 * | 6/2003 | Kamath et al. | 370/236.2 |
| 2009/0225768 A1 * | 9/2009 | Hsu et al. | 370/412 |

* cited by examiner

*Primary Examiner*—Dang T Ton
*Assistant Examiner*—Wei Zhao
(74) *Attorney, Agent, or Firm*—LeRoy D. Maunu; Lois D. Cartier (57) ABSTRACT

Approaches for sizing first-in-first-out (FIFO) buffers for pipelining functions of a circuit. Functions of the circuit are performed on an input data set, with respective FIFO buffers for buffering data elements between coupled pairs of the functional blocks. While performing the functions of the circuit, a respective current number of elements added to a FIFO buffer since a previous element was removed from the FIFO buffer is counted for each FIFO buffer, and then compared to a respective saved number. The respective current number is saved as a new respective saved number in response to the respective current number being greater than the respective saved number, and the respective current number is reset after the comparing of the respective current number to the respective saved number. Respective sizes for the FIFO buffers are determined as a function of the respective saved numbers and then the sizes are stored.

20 Claims, 7 Drawing Sheets

DETERMINING SIZES OF FIFO BUFFERS BETWEEN FUNCTIONAL BLOCKS IN AN ELECTRONIC CIRCUIT

FIELD OF THE INVENTION

The present invention generally relates to determining sizes of first-in-first-out (FIFO) buffers used between functional blocks in an electronic circuit design.

BACKGROUND

The functional blocks of a pipelined circuit have different throughput given the differences in the functions performed and differences in the input data processed by each functional block. In order to maximize the performance of asynchronous circuits, it is desirable to minimize the duration for which any of the functional blocks is kept waiting for input from any other of the functional blocks, and to minimize the duration for which any of the functional blocks is kept waiting to provide output to any other of the functional blocks.

FIFO buffers are often used between the functional blocks of a design in order to accommodate differences in throughput and variations in input data rates. One of the challenges in using FIFO buffers in a design is choosing suitable sizes for the FIFO buffers. A single size for all FIFO buffers would be unsuitable in view of the differences between the functional blocks. If a FIFO buffer is too big, it unnecessarily occupies too large a circuit area. If a FIFO buffer is too small, a functional block may have to wait for input data or wait to output data. For a design having a large number of pipelined functional blocks, the task of selecting suitable sizes for the many FIFO buffers may be difficult and time-consuming.

The present invention may address one or more of the above issues.

SUMMARY

The present invention provides various approaches for sizing first-in-first-out (FIFO) buffers for pipelining functions of a circuit. In one embodiment, a method performs the functions of the circuit on an input data set. The circuit includes respective FIFO buffers for buffering data elements between coupled pairs of the functional blocks. While performing the functions of the circuit, for each FIFO buffer, a respective current number of elements added to the FIFO buffer since a previous element was removed from the FIFO buffer is counted. The respective current number is compared to a respective saved number in response to removal of an element from the FIFO buffer. The respective current number is saved as a new respective saved number in response to the respective current number being greater than the respective saved number. The respective current number is reset after the comparing of the respective current number to the respective saved number. Respective sizes for the FIFO buffers are determined as a function of the respective saved numbers. The respective sizes for the FIFO buffers are stored.

In another embodiment, a program storage medium includes a processor-readable storage device having instructions for sizing FIFO buffers for pipelining functions of a circuit. In yet another embodiment, a system is provided for sizing FIFO buffers for pipelining functions of a circuit. The system includes a processor and a processor-readable storage device.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The various embodiments of the invention provide an approach for determining suitable sizes for first-in-first-out (FIFO) buffers that are used in pipelining functions of a circuit. The general approach entails performing the functions of the circuit on an input data set. The design of the circuit may be simulated or the actual circuit may be operated to perform the circuit's functions, depending on design objectives and restrictions. The circuit includes respective FIFO buffers for buffering data elements between coupled pairs of the functional blocks. These FIFO buffers may be automatically established as part of the design, as described in more detail below. The approaches generally seek to determine the minimum size for each FIFO buffer that may be attained while allowing sufficient space for buffering data to be passed between functional blocks. As a general measure, the maximum number of elements added to a FIFO buffer before an element is removed is determined while performing the functions of the circuit. This maximum number is used in determining the size of the FIFO buffer. Thus, while performing the functions of the circuit, for each FIFO buffer the number of elements added to the FIFO buffer is counted until an element is removed from the FIFO buffer. When an element is removed, the count is compared to the current maximum count of additions until a removal. If the current count is greater than the current maximum count, the current count is saved as the new maximum. The count of additions is then reset for counting additions until the next removal. The respective sizes for the FIFO buffers are determined based on the respective maximum counts for the FIFO buffers.

The above-described approach is beneficial over simply using the maximum depth the FIFO buffer reaches during simulation. An example scenario illustrating the benefit is where one functional block is capable of pushing a new value onto the FIFO buffer every 1 ns, but a consumer functional block can pull only one value from the FIFO buffer every 5 ns.

In this particular case, the maximum depth of the FIFO buffer is dependent on how long the simulation is run, because for every five nanoseconds the FIFO buffer will grow by four. With the embodiments of the present invention, the FIFO buffer will be given a depth of at most 5, which should be sufficient to avoid slowing down the circuit.

Figure 1:
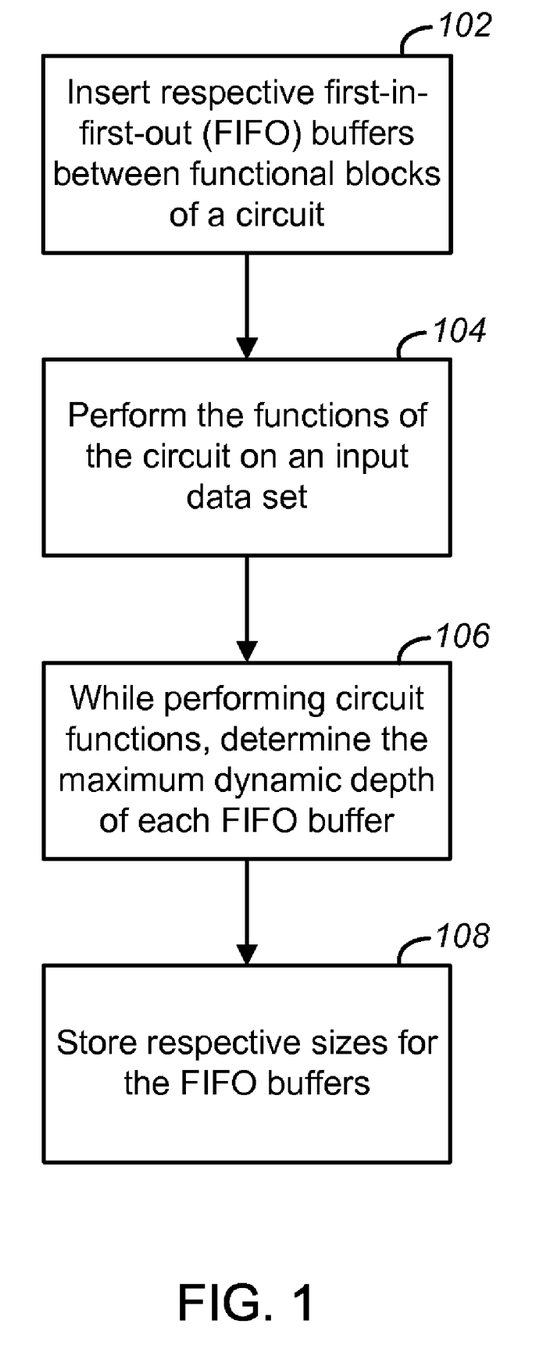
FIG. 1 illustrates a flow diagram of a process for sizing first-in-first-out (FIFO) buffers used in pipelining functions of a circuit, according to an example embodiment of the present invention.
Figure 2:
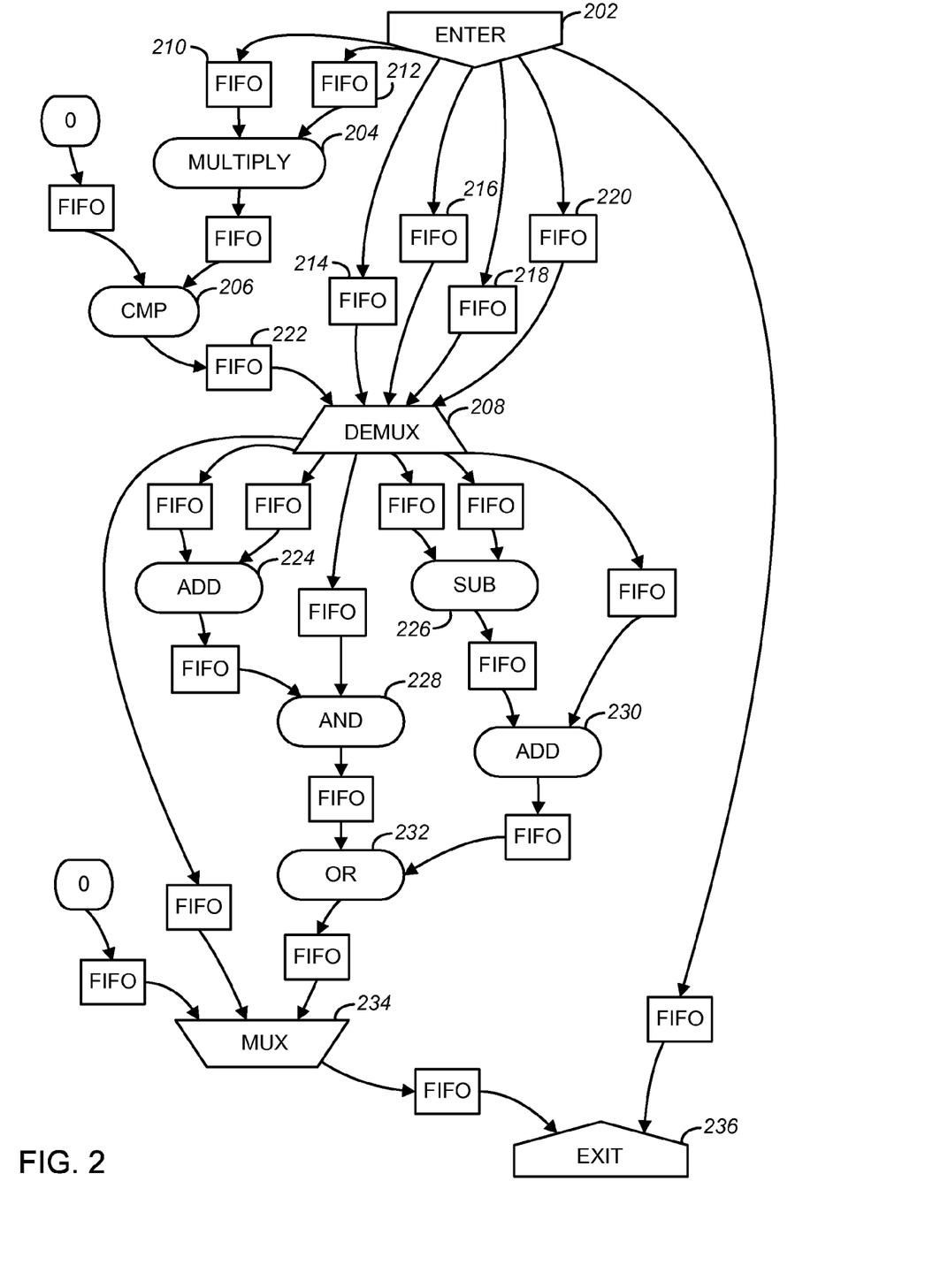
FIG. 2 is an example graph that illustrates the functional blocks of a circuit with FIFO buffers, according to an example embodiment of the present invention.

FIG. 1 is a flowchart that shows a process for sizing FIFO buffers used in pipelining functions of a circuit, in accordance with various embodiments of the present invention. Respective FIFO buffers are inserted between functional blocks of a circuit in step 102. Each FIFO buffer allows a functional block to process its next set of inputs without having to wait for the next functional block in the pipeline to be ready for output data from that functional block. In one embodiment, FIFO buffers may be automatically inserted at each data input of every functional block of the design. In an alternative embodiment, the timing paths between functional blocks may be analyzed (as described further in the examples that follow) to determine which paths do not need FIFO buffers. An example of a circuit that has FIFO buffers inserted between all functional blocks is shown in FIG. 2.

The functions of the circuit are then performed on an input data set in step 104. For example, operation of the circuit is simulated using input data and control signals consistent with the expected real-world conditions. There are a number of methods that may be used to simulate circuits. ModelSim, for example, is a commonly used logic simulator for application specific integrated circuits (ASICs) and designs for programmable ICs such as field programmable gate arrays (FPGAs). The user provides data for the simulation that is representative of the data expected when the implemented circuit is operating in its intended application, since the sizes of the FIFO buffers will be determined based on the data provided for the simulation.

For the purposes of simulation, the FIFO buffers are assumed to have unlimited depth. Whenever the functional block driving a FIFO buffer has a result generated, it is assumed that the FIFO buffer will be able to store that result. In one implementation, the circuit is an asynchronous programmable logic device (PLD) and the inserted FIFO buffers have a depth substantially greater than what would be anticipated being needed. During the simulation, the FIFO buffers store information about how deep the FIFO buffer actually needs to be, which can be read back either with boundary scan or other methods that are available from the PLD.

The sizes of the FIFO buffers are chosen based on the results of the simulation. In order to minimize the size of the resulting circuit, the size of each FIFO buffer is set to the minimum size required to handle the data provided in the simulation. While the functions of the circuit are performed on an input data set, the adding and removing of elements of each FIFO buffer is monitored to determine a maximum dynamic depth, as shown by step 106. For example, during operation the simulation model counts the number of data elements added to the FIFO buffer since the last removal of a data element from the FIFO buffer. The dynamic depth is the greater of the current count and a previously stored dynamic depth. Once an item is removed from the FIFO buffer, the count is reset to zero; the dynamic depth is saved for a subsequent comparison. Thus, the dynamic depth of a FIFO is the largest of the numbers of data items added to the FIFO buffer and counted between removals of data items. The sizes for the FIFO buffers are then determined based on the dynamic depths determined from the simulation. The actual depth of a FIFO buffer is one less than its dynamic depth, since a FIFO buffer having a dynamic depth of one is unnecessary and can be removed. The sizes for each of the FIFO buffers are then stored in step 108. The determined sizes for the FIFO buffers will likely provide sufficient space for buffering data in the final implemented circuit.

FIG. 2 is a graph that illustrates the functional blocks of an example circuit with FIFO buffers inserted between all functional blocks. Electronic circuits can be represented as a graph, which consists of functional blocks (or nodes), connected by wires (or arcs). In the graph of FIG. 2, the functional blocks represent higher level functions, such as add, multiply, etc. Those skilled in the art will recognize that the approaches described herein may be applied to either higher-level or lower-level circuits.

The connecting arcs between ENTER block 202 and DEMUX block 208 show where buffering may be beneficial in order to efficiently pipeline functions of the circuit. Using the connections (or arcs) between ENTER block 202 and DEMUX block 208 as an example, several of the connections are direct from the ENTER block 202 to the DEMUX block 208, while some of the connections are via MULTIPLY block 204 and CMP block 206. In order to efficiently pipeline the functions represented by the graph, the direct connections from the ENTER block 202 to the DEMUX block 208 need to buffer the data for a period of time that matches the time it takes for the MULTIPLY block 204 and the CMP block 206 to perform their functions and propagate the data to the DEMUX block 208. Specifically, in a pipelined arrangement all outputs from the ENTER block 202 occur at the same time, with a goal of one set of output values provided on each cycle to the FIFO buffers 210, 212, 214, 216, 218, and 220. Thus, if any one of the direct ENTER→DEMUX FIFO buffers 210, 212, 214, 216, 218, and 220 is full, another set of output values from the ENTER block cannot be permitted. When the MULTIPLY→CMP blocks complete processing and provide an output value to the DEMUX block via FIFO buffer 222, the DEMUX block reads a set of values from the ENTER→DEMUX FIFO buffers 214, 216, 218, and 220. A new set of values can then be output from the ENTER block to the FIFO buffers 210, 212, 214, 216, 218, and 220. The ENTER block again must wait for the values from FIFO buffers 210 and 212 to flow through the MULTIPLY→CMP blocks before a new set of values can be output. The outcome is that there are many cycles where the ENTER block must wait to output a set of values.

The graph of FIG. 2 further includes ADD block 224, SUB block 226, AND block 228, ADD block 230, OR block 232, MUX block 234, and EXIT block 236. These functional blocks are connected, some directly and some indirectly.

In order for asynchronous systems to work in the absence of a clock, there generally needs to be a mechanism for one functional block to communicate that a value is ready for the next functional block in the pipeline. That next block then needs to make sure that all of its input values are ready and wait if those values are not ready. Thus, the previous block must hold its output data until the next block is ready to receive the data. Once a block has all of its input values available and the block is ready to process the data, the block must signal the previous block(s) that the data has been received in order to enable the previous block(s) to process the next set of input values. Assuming that the graph of FIG. 2 represents an asynchronous circuit, this hand-shaking is implied by the arrows in the graph. The backpressure created when one functional block is required to wait, which forces the blocks providing input data to the one functional block to wait, can build to the point where the entire circuit is waiting.

With reference to FIG. 2, if there were no buffers on the direct connections between the ENTER block 202 and the DEMUX block 208, then during the time that the MULTIPLY block 204 and the CMP block 206 are executing, no additional inputs could be received by the ENTER block 202. To address this problem, FIFO buffers are used between functional blocks to hold a predefined number of results. The FIFO buffers of FIG. 2 are assumed to have unlimited depth. The actual size needed for each of the FIFO buffers is then determined, as is discussed in detail in relation to FIGS. 3 and 4. In one implementation, each FIFO buffer uses the same hand-shaking protocol with the two connected functional blocks as that which would be used between the two functional blocks if connected without a FIFO buffer. This approach allows the FIFO buffers to be inserted between functional blocks without changing the function of the blocks.

As an example, assuming that all of the functional blocks take the same amount of time to execute, inserting a FIFO buffer capable of holding two values (i.e., a two-deep FIFO buffer) on the direct connections between the ENTER block 202 and DEMUX block 208 allows the circuit to run at full speed. While the MULTIPLY block 204 and the CMP block 206 are executing, the values from the ENTER block 202 can be held in the FIFO buffers until the DEMUX block 208 receives the result from the CMP block 208. In one implementation, FIFO buffers are placed on connections between functional blocks in a manner that prevents backpressure and maximizes the performance of the circuit. In another implementation, the FIFO buffers are placed only on connections where they are needed and the FIFO buffers are as small as possible (e.g., capable of holding only the minimum required number of data values) in order to minimize the size of the circuit.

If the timing of all functional blocks is fixed and known in advance, it is possible to statically balance the FIFO buffer depths to ensure maximum performance. However, in asynchronous circuits the timing of the functional blocks typically cannot be accurately predicted at synthesis time. Also, the timing of a functional block may be data dependent, such as an implementation of a FOR loop in which the number of iterations depends on the input data. In the FOR loop example, the values of input data would be unknown and suitable sizes of FIFO buffers may not be accurately determined when using static analysis. In contrast, by simulating the pipelined circuit design (or operating a prototype circuit) using data values expected for an implemented circuit, the behavior of the function blocks may be observed in a dynamic environment and suitable sizes of FIFO buffers may be more accurately determined.

In an example embodiment, the circuit design is represented as a graph such as the example shown in FIG. 2. FIG. 2 shows a pre-simulation state of the graph, in which a FIFO buffer is inserted on every arc in the graph. Other implementations may limit insertion of FIFO buffers to those points in the graph where different timing domains meet. A "timing domain," as the term is used herein, refers to paths whose total delay is known to be the same. There are two instances in which this occurs. First, if all paths in a given timing domain go through exactly the same functional blocks then the paths have the same delay. For example, the two paths from the ENTER block 202 to the MULTIPLY block 204 fall into this category. Second, paths that go through functional blocks that have known identical timing have the same delay. For example, if the ADD block 224, the SUB block 226, the AND block 228, and the ADD block 230 are all known to have identical timing, then there are several paths between the DEMUX block 208 and the OR block 232 that have the same timing. The actual timing of the paths between the functional blocks need not be known.

In another embodiment, FIFO buffers may be placed on all of the inputs of a functional block where paths from different timing domains meet, except for those inputs on the slowest path. For example, the inputs to DEMUX block 208 are connected to paths from two different timing domains. One of the timing domains has the paths that directly connect the ENTER block 202 to the DEMUX block 208, and the other timing domain has the path that connects to an input of DEMUX block 208 through CMP block 206. In this embodiment, the paths that directly connect ENTER block 202 to DEMUX block 208 are faster than the path that flows through CMP block 206 and the path that flows through CMP block 206 is the slowest. Thus, FIFO buffers 214, 216, 218, and 220 are inserted at the inputs of the DEMUX block, while FIFO buffer 222 is omitted.

The procedure for determining whether a functional block needs to have one or more FIFO buffers inserted at its inputs involves following the paths from all of the inputs of the functional block backward through the graph until those paths converge at outputs from the same node. In the graph of FIG. 2, all inputs to the graph eventually merge at the ENTER block 202. However, many of the inputs merge at the DEMUX block 208. If the timing of the paths between the functional block at which they diverge and the functional block in question is known to be identical, then the paths need not have FIFO buffers inserted at the inputs of the functional block in question. If the timing of the paths is not known to be identical, however, then a FIFO buffer is inserted on each of the inputs of the functional block. In one implementation, the input(s) to the functional block from the timing domain with the slowest path from the point of the common source block does not have a FIFO buffer inserted. For example, on the DEMUX block 208, the input that goes through the MULTIPLY block 204 and the CMP block 206 will be slower than the other paths. Thus, FIFO buffer 222 need not be inserted on this path. However, it is often not possible in an asynchronous circuit to know the timing well enough to decide which path is slowest. Thus, in some embodiments FIFO buffers are placed on all paths where different timing domains meet. In some instances, the paths through a particular functional block do not necessarily have the same timing. In this instance, FIFO buffers are inserted at all inputs of all functional blocks, as shown in FIG. 2, and then FIFO buffers that are unnecessary are identified and removed. A simulation is performed using an input data set in order to determine the actual sizes of the FIFO buffers and also to determine which FIFO buffers can be removed.

Figure 3:
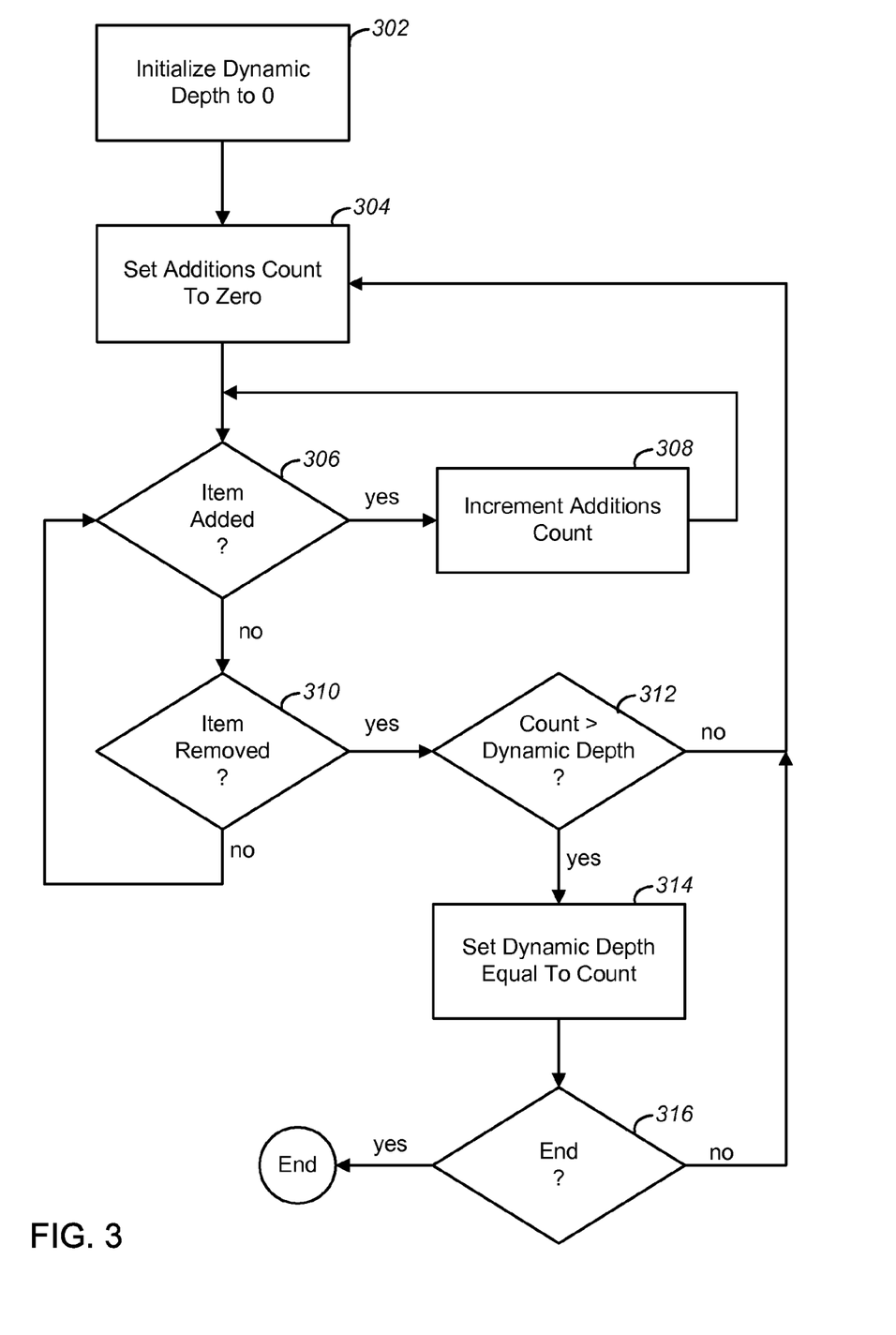
FIG. 3 is a flowchart of an example process for determining the dynamic depth of a FIFO buffer in accordance with various embodiments of the invention.
Figure 4A:
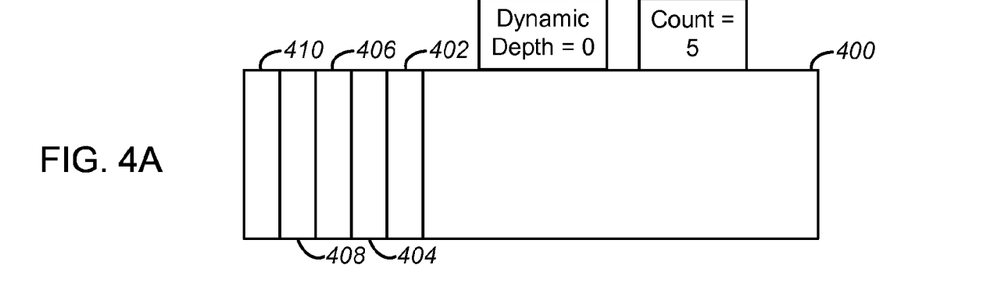
FIGS. 4A-4D show an example sequence of additions and removals from a FIFO buffer and the updating of the associated dynamic depth value, according to an example embodiment of the present invention.

FIG. 3 is a flowchart of an example process for determining the dynamic depth of a FIFO buffer in accordance with various embodiments of the invention. The dynamic depth of each FIFO buffer is used to determine the appropriate size for each FIFO buffer.

In beginning the process of performing the functions of the circuit, the dynamic depth of the FIFO buffer is initialized to zero in step 302. It may be recalled that the functions of the circuit may be performed by way of simulation or by operating a physical circuit, depending on design and implementation objectives. The process tracks the maximum of the numbers of data items that are added to the FIFO buffer between removals of data items from the FIFO buffer. An additions counter, which stores the number for additions between removals, is set to zero in step 304. When a data item is added to the FIFO buffer (decision step 306), then the additions count is incremented in step 308 and the process returns to decision step 306.

If a data item is not added but is removed from the FIFO buffer (decision step 310), the process determines whether the value of the additions count is greater than the dynamic depth in step 312. If the value of the additions count is not greater than the dynamic depth, then the process returns to step 304 where the additions count is reset to zero. The process then repeats steps 306-310 until another data item is removed from the FIFO buffer. If the value of the additions count is greater than the dynamic depth, then the dynamic depth is set to the value of the additions count in step 314. The process then proceeds to step 316 where it is determined whether or not performing the circuit functions is complete. If continued performance of the functions of the circuit is desired, then the process returns to step 304 where the additions count is reset to zero. The process then repeats steps 306-310 until another data item is removed from the FIFO buffer.

When the process of performing the functions of the circuit is complete, the dynamic depth indicates the maximum of the numbers of data items that were added to the FIFO buffer between removals of data items from the FIFO buffer. The appropriate size for the FIFO buffer based upon the results of the simulation is one less than the dynamic depth of the FIFO buffer determined by the process of FIG. 3. A dynamic depth of one indicates that the FIFO buffer is unnecessary, and thus the FIFO buffer can be removed from the circuit.

FIGS. 4A-4D show an example sequence of additions and removals from a FIFO buffer 400 and the updating of the associated dynamic depth value, according to an example embodiment of the present invention. The FIFO buffer 400 is assumed to have an unlimited depth for the purposes of simulation. At the beginning of the simulation, the FIFO buffer 400 is empty and the dynamic depth of the FIFO buffer 400 is initially set to zero. FIG. 4A shows that five data items 402-410 have been added to the FIFO buffer 400, without a data item having been removed from the FIFO buffer 400. The additions count for the FIFO buffer 400 is set to a value of five to represent the number of data items that were added to the FIFO buffer 400. Note that the dynamic depth does not get changed from its initial value of zero until an item is removed from the FIFO buffer.

Figure 4B:
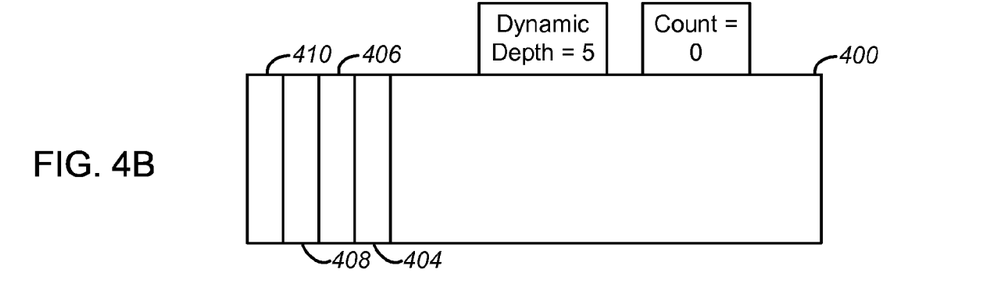

FIG. 4B shows that data value 402 has been removed from the FIFO buffer 400. The value of the additions count for the FIFO buffer 400 is compared to the dynamic depth of the FIFO buffer. The dynamic depth of the FIFO buffer 400 is set to the value of the additions count (i.e., 5) because the value of the additions count is greater than the dynamic depth (i.e., 0). The additions count of the FIFO buffer 400 is then reset to zero.

Figure 4C:
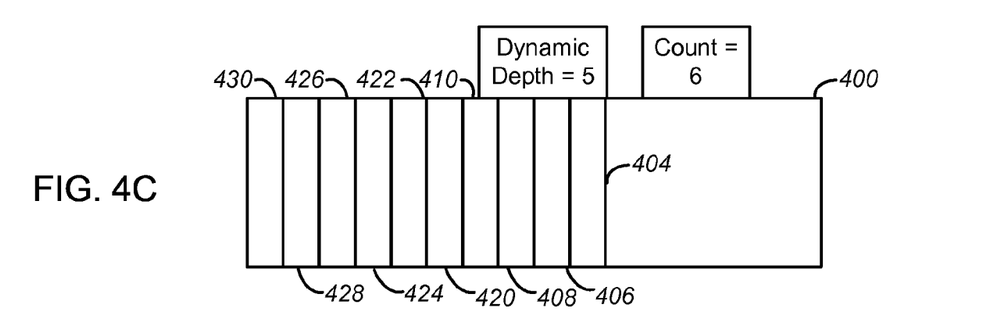

FIG. 4C shows that six additional data items 420-432 have been added to the FIFO buffer, without another data item having been removed from the FIFO buffer 400. The additions count for the FIFO buffer 400 is set to a value of six to represent the number of data items that were added to the FIFO buffer 400 since the last removal of an item.

Figure 4D:
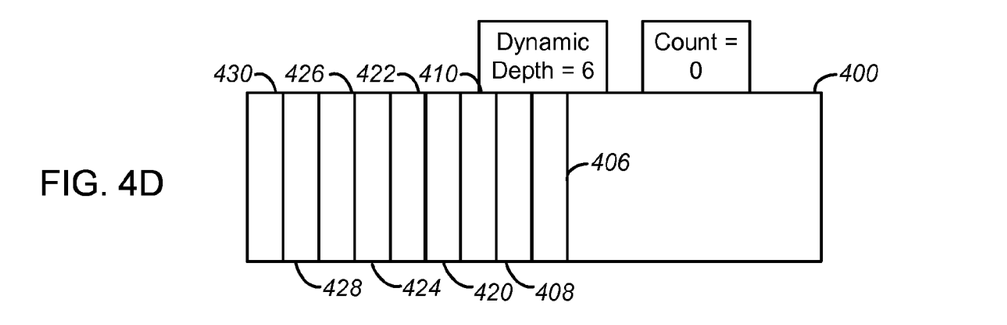

FIG. 4D shows that data value 404 has been removed from the FIFO buffer 400. The value of the additions count for the FIFO buffer 400 is compared to the dynamic depth of the FIFO buffer. The dynamic depth of the FIFO buffer 400 is set to the value of the additions count (i.e., 6) because the value of the additions count is greater than the dynamic depth (i.e., 5). The additions count of the FIFO buffer 400 is then reset to zero. When the process of performing the functions of the circuit is deemed to be complete, the dynamic depth of the FIFO buffer 400 represents that maximum of the numbers of data items that were added to the FIFO buffer 400 between removals of data items.

Figure 5:
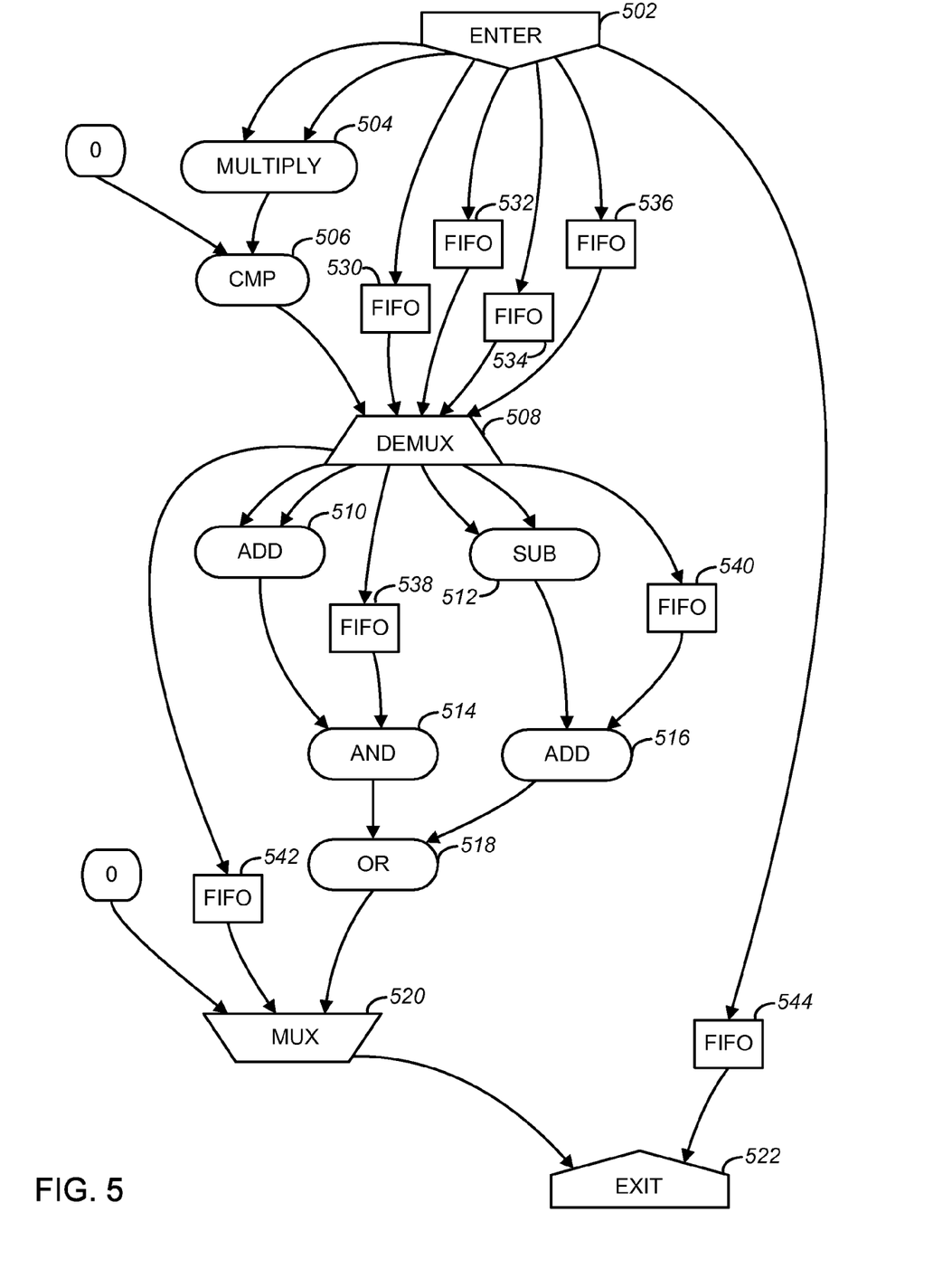
FIG. 5 is a graph that illustrates the functional blocks of an example circuit and the FIFO buffers determined to be beneficial after performing the functions of the circuit.

FIG. 5 is a graph that illustrates the functional blocks of an example circuit and the FIFO buffers determined to be beneficial after performing the functions of the circuit. The functional blocks of FIG. 5, ENTER block 502, MULTIPLY block 504, CMP block 506, DEMUX block 508, ADD block 510, SUB block 512, AND block 514, ADD block 516, OR block 518, MUX block 520, and ENTER block 522, correspond to the functional blocks in the graph of FIG. 2. After performing the functions of the circuit, those FIFO buffers that have a dynamic depth of one are unnecessary and can be removed from the circuit. For example, the FIFO buffers on the paths between the ENTER block 502 and the MULTIPLY block 504 have been removed in FIG. 5. FIFO buffers are not required on these paths, because they have the same timing. As another example, the FIFO buffer on the path between the CMP block 506 and the DEMUX block 508 has also been removed in FIG. 5. The path from the ENTER block 502 to the DEMUX block 508 that passes though the CMP block 508 is the slowest path from the ENTER block 502 to the DEMUX block 508. As such, the FIFO buffers along this path are unnecessary and they have been removed from the circuit in FIG. 5. The FIFO buffers 530-536 along the remaining paths between the ENTER block 502 and the DEMUX block 508 have been resized based on the results of performing the functions of the circuit. The size of each of the FIFO buffers 530-536 is set to one less than the dynamic depth of that FIFO buffer (dynamic depth−1), as was determined during the simulation.

The example shown in FIG. 5 assumes that the ADD block 510, the SUB block 512, the AND block 514, and the ADD block 516 have identical timing. Thus, FIFO buffers were determined not to be needed at the inputs of OR block 518. The sizes of FIFO buffers 538 and 540 are set to one less than the dynamic depth of that FIFO buffer, as was determined during performing the functions of the circuit. The rest of the FIFO buffers on the paths between the DEMUX block 508 and the OR block 518 are unnecessary, and they have been removed from the circuit in FIG. 5. If the ADD block 510, the SUB block 512, the AND block 514 and the ADD block 516 did not have identical timing, then other FIFO buffers in addition to the FIFO buffers 538 and 540 may have been required.

The results of performing the functions of the circuit indicated that FIFO buffer 542 is needed between the DEMUX block 508 and the MUX block 520 and that FIFO buffer 544 is needed between ENTER block 502 and EXIT block 522. The results of performing the functions of the circuit also provide the appropriate sizes for the FIFO buffers 542 and 544.

Figure 6:
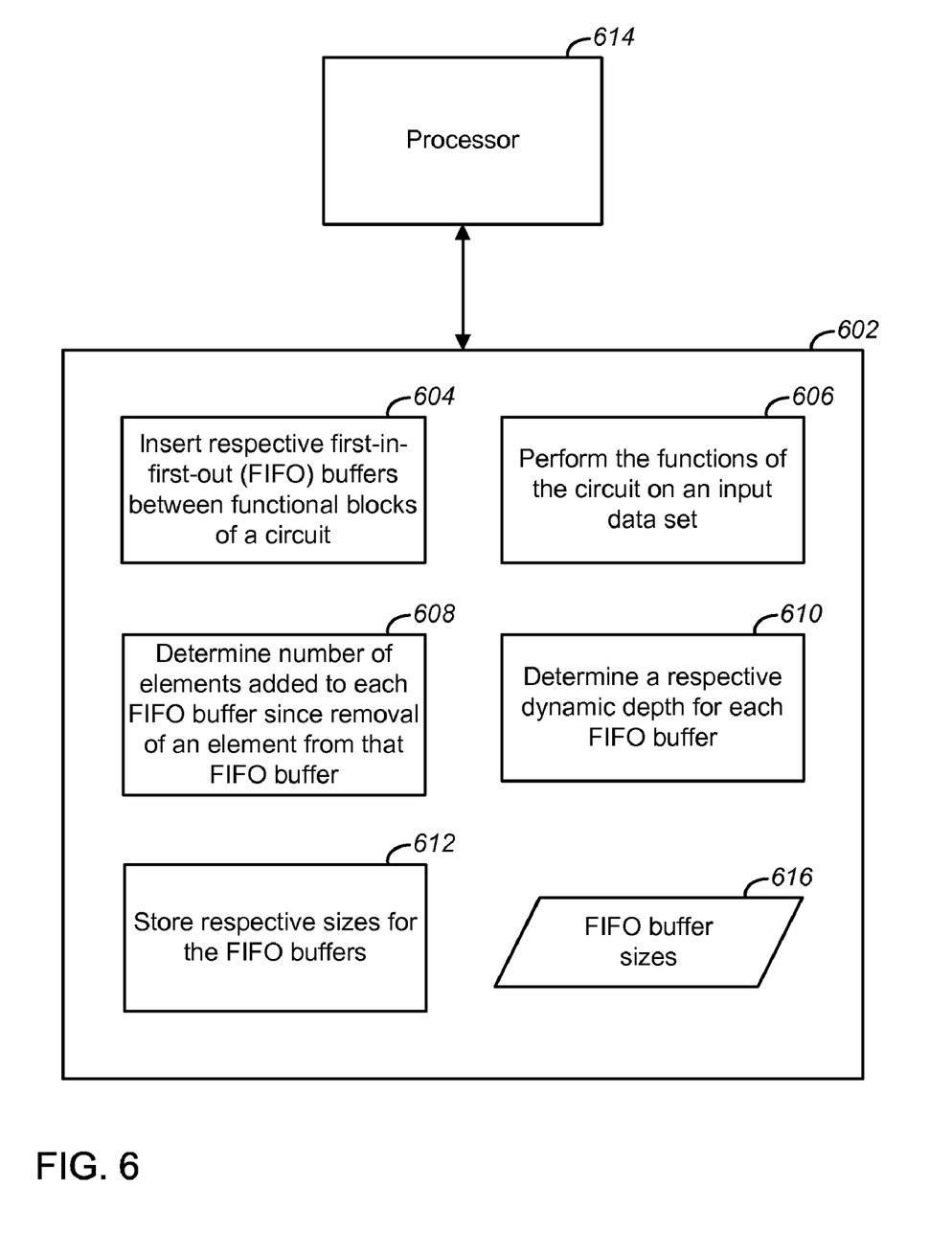
FIG. 6 illustrates a block diagram of a system for sizing the FIFO buffers for pipelining functions of a circuit in accordance with various example embodiments of the present invention.

FIG. 6 illustrates a block diagram of a system for sizing the FIFO buffers for pipelining functions of a circuit in accordance with various embodiments of the invention.

Processor-readable device 602 is configured with software modules 604, 606, 608, 610, and 612. Execution of the instructions of software modules 604, 606, 608, 610, and 612 by processor 614 (or multiple processors) causes processor 614 to determine the sizes of the FIFO buffers for pipelining functions of a circuit and to store the FIFO buffer sizes. In one embodiment, the FIFO buffer sizes 616 are stored on the processor readable device 602.

Execution of the instructions of software module 604 causes processor 614 to insert respective FIFO buffers between functional blocks of the circuit. Execution of the instructions of software module 606 causes processor 614 to perform the functions of the circuit on an input data set. Execution of the instructions of software module 608 causes processor 614 to determine the number of data elements that are added to each of the FIFO buffers since the removal of a data element from that FIFO buffer. Execution of the instructions of software module 610 causes processor 614 to determine a respective dynamic depth for each of the FIFO buffers. Execution of the instructions of software module 612 causes processor 614 to store the respective sizes of the FIFO buffers. The size of each of the FIFO buffers is based on its dynamic depth.

Figure 7:
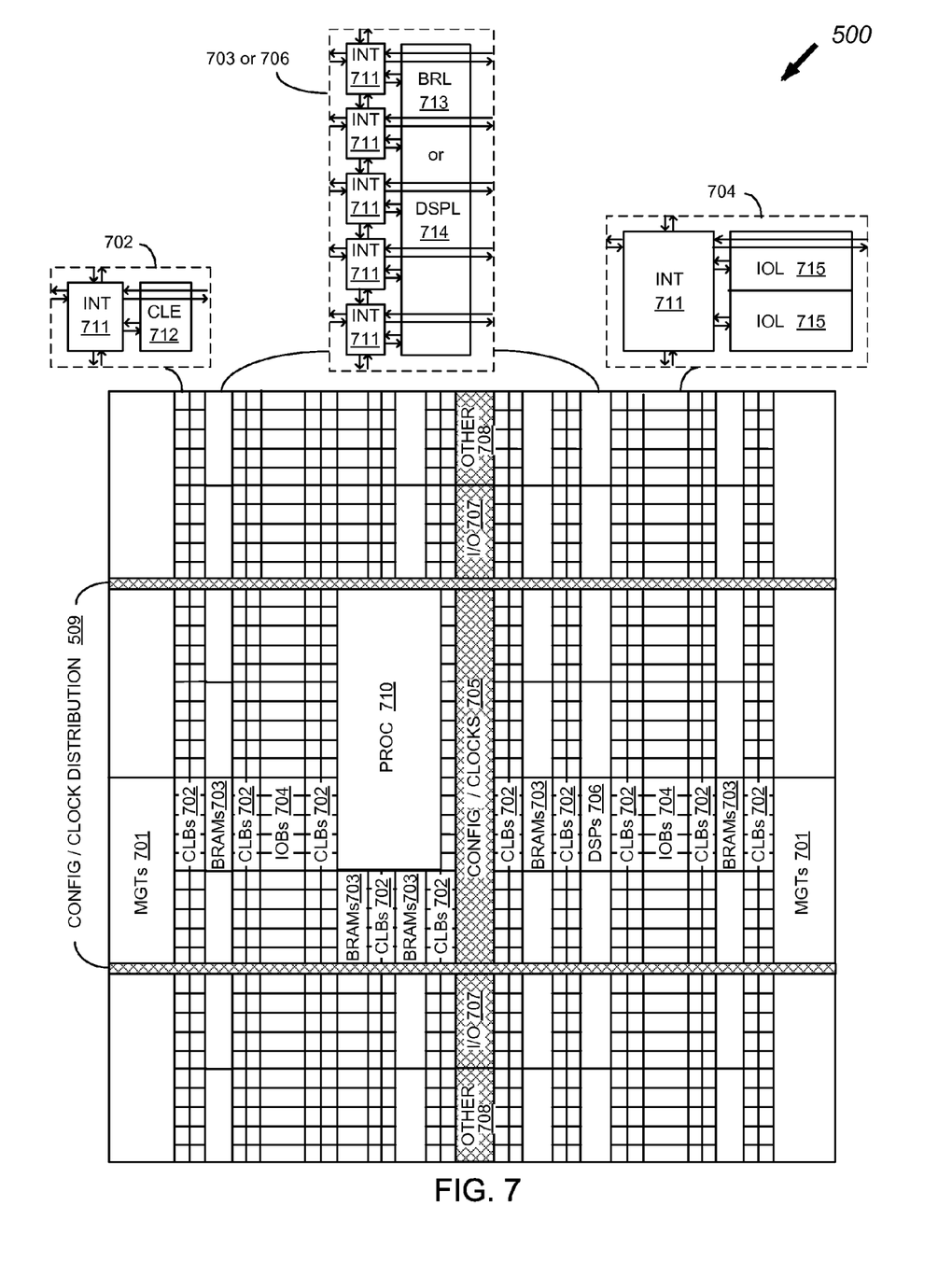
FIG. 7 illustrates an architecture of an example field programmable gate array (FPGA) that includes several different types of programmable logic blocks.

FIG. 7 is a diagram of an example field programmable gate array (FPGA) on which a circuit may be implemented for sizing the FIFO buffers used in pipelining functions of the circuit. The FPGA of FIG. 7 includes several different types of programmable logic blocks. Those skilled in the art will appreciate that the FPGA of FIG. 7 provides only one example of an integrated circuit device on which the methods of the present invention can be practiced.

Advanced FPGAs can include several different types of programmable logic blocks in the array. For example, FIG. 7 illustrates an FPGA architecture 700 that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of methods for sizing FIFO buffers for pipelining functions of the circuit. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for sizing first-in-first-out (FIFO) buffers for pipelining functions of a circuit, the method comprising:
performing the functions of the circuit on an input data set, wherein the circuit includes respective FIFO buffers for buffering data elements between coupled pairs of functional blocks;
while performing the functions of the circuit, for each FIFO buffer,
counting a respective current number of elements added to the FIFO buffer since a previous element was removed from the FIFO buffer,
comparing the respective current number to a respective saved number in response to removal of an element from the FIFO buffer,
saving the respective current number as a new respective saved number in response to the respective current number being greater than the respective saved number, and
resetting the respective current number after the comparing of the respective current number to the respective saved number;
determining respective sizes for the FIFO buffers as a function of the respective saved numbers; and
storing the respective sizes for the FIFO buffers in a computer-readable storage medium that provides non-transitory storage.

2. The method of claim 1, wherein performing the functions of the circuit includes simulating the circuit.

3. The method of claim 1, wherein performing the functions includes operating the circuit on a programmable integrated circuit.

4. The method of claim 1, further comprising establishing the respective FIFO buffers at all inputs of each of the functional blocks.

5. The method of claim 1, wherein the respective size of each of the FIFO buffers is equal to one less than the respective saved number of the FIFO buffer.

6. The method of claim 1, further comprising removing from the circuit each of the FIFO buffers that has a respective saved number of one.

7. The method of claim 1, further comprising:
for each of two or more paths to respective inputs of a functional block, determining whether the two or more paths have equal or unequal timing; and
in response to determining that the two or more paths have unequal timing, establishing respective FIFO buffers at the respective inputs of the functional block.

8. The method of claim 1, further comprising:
for each of two or more paths to respective inputs of a functional block, determining a slowest of the paths; and
establishing respective FIFO buffers at each input of the functional block other than the input for the slowest path.

9. The method of claim 1, further comprising:
in a graph representation of the circuit, for respective paths to each of two or more inputs of a first functional block, determining a second functional block from which the respective paths diverge;
determining whether the respective paths have equal or unequal timing from the second functional block to the first functional block; and
in response to determining that the respective paths have unequal timing, establishing respective FIFO buffers at the two or more inputs of the first functional block.

10. The method of claim 1, wherein performing the functions of the circuit includes simulating the circuit, the method further comprising:
establishing the respective FIFO buffers at all inputs of each of the functional blocks.

11. A non-transitory program storage medium, comprising:
a processor-readable storage device configured with instructions for sizing first-in-first-out (FIFO) buffers for pipelining functions of a circuit, wherein execution of the instructions by one or more processors causes the one or more processors to perform operations including:
performing the functions of the circuit on an input data set, wherein the circuit includes respective FIFO buffers for buffering data elements between coupled pairs of functional blocks;
while performing the functions of the circuit, for each FIFO buffer,
counting a respective current number of elements added to the FIFO buffer since a previous element was removed from the FIFO buffer,
comparing the respective current number to a respective saved number in response to removal of an element from the FIFO buffer,
saving the respective current number as a new respective saved number in response to the respective current number being greater than the respective saved number, and
resetting the respective current number after the comparing of the respective current number to the respective saved number;
determining respective sizes for the FIFO buffers as a function of the respective saved numbers; and
storing the respective sizes for the FIFO buffers.

12. The program storage medium of claim 11, wherein performing the functions of the circuit includes simulating the circuit.

13. The program storage medium of claim 11, wherein performing the functions includes operating the circuit on a programmable integrated circuit.

14. The program storage medium of claim 11, the operations further including establishing the respective FIFO buffers at all inputs of each of the functional blocks.

15. The program storage medium of claim 11, wherein the respective size of each of the FIFO buffers is equal to one less than the respective saved number of the FIFO buffer.

16. The program storage medium of claim 11, the operations further including removing from the circuit each of the FIFO buffers that has a respective saved number of one.

17. The program storage medium of claim 11, the operations further including:
for each of two or more paths to respective inputs of a functional block, determining whether the two or more paths have equal or unequal timing; and
in response to determining that the two or more paths have unequal timing, establishing respective FIFO buffers at the respective inputs of the functional block.

18. The program storage medium of claim 11, the operations further including:
for each of two or more paths to respective inputs of a functional block, determining a slowest of the paths; and
establishing respective FIFO buffers at each input of the functional block other than the input for the slowest path.

19. The program storage medium of claim 11, the operations further including:
in a graph representation of the circuit, for respective paths to each of two or more inputs of a first functional block, determining a second functional block from which the respective paths diverge;
determining whether the respective paths have equal or unequal timing from the second functional block to the first functional block; and
in response to determining that the respective paths have unequal timing, establishing respective FIFO buffers at the two or more inputs of the first functional block.

20. A system for sizing first-in-first-out (FIFO) buffers for pipelining functions of a circuit, the system comprising:
a processor;
a processor-readable storage device coupled to the processor and configured with instructions for sizing the first-in-first-out (FIFO) buffers for pipelining the functions of a circuit, wherein execution of the instructions by the processor causes the processor to perform operations including:
performing the functions of the circuit on an input data set, wherein the circuit includes respective FIFO buffers for buffering data elements between coupled pairs of the functional blocks;
while performing the functions of the circuit, for each FIFO buffer,
counting a respective current number of elements added to the FIFO buffer since a previous element was removed from the FIFO buffer,
comparing the respective current number to a respective saved number in response to removal of an element from the FIFO buffer,
saving the respective current number as a new respective saved number in response to the respective current number being greater than the respective saved number, and
resetting the respective current number after the comparing of the respective current number to the respective saved number;
determining respective sizes for the FIFO buffers as a function of the respective saved numbers; and
storing the respective sizes for the FIFO buffers.

* * * * *